(12) United States Patent
Jeon et al.

(10) Patent No.: US 7,692,455 B2
(45) Date of Patent: Apr. 6, 2010

(54) SEMICONDUCTOR DEVICES FOR RECEIVING A CURRENT MODE SIGNAL AND METHODS OF OPERATING THE SAME

(75) Inventors: Yong-Weon Jeon, Gyeonggi-do (KR); Jang-Jin Nam, Gyeonggi-do (KR); Dong-Hoon Baek, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 11/937,670

(22) Filed: Nov. 9, 2007

(65) Prior Publication Data

US 2008/0122493 A1      May 29, 2008

(30) Foreign Application Priority Data

Nov. 9, 2006    (KR) .................. 10-2006-0110545

(51) Int. Cl.
   *H03K 5/153*    (2006.01)
(52) U.S. Cl. .................. 327/77; 327/87; 327/88; 327/103; 327/205; 327/206
(58) Field of Classification Search .................. 327/77, 327/87–88, 205–206, 103
   See application file for complete search history.

(56) References Cited

U.S. PATENT DOCUMENTS 6,198,323 B1 *   3/2001   Offord ..................... 327/202

2006/0109041 A1 *   5/2006   Tseng et al. ................ 327/205

FOREIGN PATENT DOCUMENTS

JP       05-103499      4/1993
JP       05-175799      7/1993

* cited by examiner

*Primary Examiner*—Lincoln Donovan
*Assistant Examiner*—John W Poos
(74) *Attorney, Agent, or Firm*—Myers Bigel Sibley & Sajovec, P.A.

(57) ABSTRACT

Embodiments of methods and apparatus for receiving data are disclosed. More particularly, methods of receiving a current mode signal, which can improve a signal to noise ratio (SNR) according to a change in a power supply voltage, and current mode comparators and semiconductor devices that use the methods are provided. A method of receiving a current mode signal includes receiving a reference current signal and a data current signal through a channel and generating a sensing voltage based on a difference between the reference current signal and the data current signal, varying a transconductance to reduce an input resistance of the current mode comparator in inverse proportion to an increase in a power supply voltage supplied to the current mode comparator, and converting the sensing voltage into a CMOS level output signal using the current mode comparator.

14 Claims, 7 Drawing Sheets

SEMICONDUCTOR DEVICES FOR RECEIVING A CURRENT MODE SIGNAL AND METHODS OF OPERATING THE SAME

CROSS-REFERENCE TO RELATED PATENT APPLICATION

This application claims the benefit of Korean Patent Application No. 10-2006-0110545, filed on Nov. 9, 2006, in the Korean Intellectual Property Office, the disclosure of which is incorporated herein in its entirety by reference.

BACKGROUND OF THE INVENTION

1. Field of the Invention

The present invention relates to methods apparatus for receiving data, and, more particularly, to methods of receiving a current mode signal, which can improve a signal to noise ratio (SNR) according to a change in a power supply voltage, and current mode comparators and semiconductor devices that use the methods.

2. Description of the Related Art

In general, semiconductor devices receive and transmit data in the form of a voltage signal or a current signal with other semiconductor devices. Typically, the current signal is more effective in high-speed operation than the voltage signal.

Semiconductor devices receiving data in the form of a current signal may require a current mode receiving circuit that receives a current signal and extracts data. Current mode comparator circuits may be used as current mode receiving circuits. Current mode comparator circuits are data detection circuits that determine a logic state of data based on a difference between a received data current signal and a predetermined reference current signal.

FIG. 1 is a circuit diagram of a conventional current mode receiving circuit. Referring to FIG. 1, the conventional current mode receiving circuit includes a receiver 110 and a comparator 120. Information corresponding to a difference between an input data current signal Idata and a reference current signal Iref is represented as a change in a voltage V1 of a first node NO1. The change in the voltage V1 of the first node NO1 is converged into a CMOS level voltage signal RxData by two NAND gates ND1 and ND2 of the comparator 120. The comparator 120 is called a current to voltage converter because the comparator 120 converts the received data current signal Idata into the voltage signal RxData.

Two transistors MN and MP of the comparator 120 are used to limit the voltage V1 of the first node NO1. The two transistors MN and MP operate in a saturation region, and only one of the two transistors MN and MP operates according to the relative levels of the input data current signal Idata and the reference current signal Iref.

If the input data current signal Idata is lower than the reference current signal Iref, the voltage V1 of the first node NO1 is higher than a predetermined voltage, for example, VDD/2, and a voltage V2 of a second node NO2 is at a low level and the output data RxData is at a high level. At this time, the NMOS transistor MN is turned off and the PMOS transistor MP is turned on, such that a current In (In=Iref−Idata) corresponding to a difference between the reference current signal Iref and the data current signal (Idata) flows to a ground terminal through the PMOS transistor MP. The NMOS transistor MN is turned off, and, thus, the voltage V1 of the first node NO1 is stabilized.

On the other hand, if the input data current signal Idata is higher than the reference current signal Iref, the voltage V1 of the first node NO1 is lower than the predetermined voltage, for example, VDD/2, and the voltage V2 of the second node NO2 is at a high level and the output data RxData is at a low level. At this time, the NMOS transistor MN is turned on and the PMOS transistor MP is turned off, such that a current In (In=Idata−Iref) corresponding to a difference between the reference current signal Iref and the data current signal Idata is supplied to the first node NO1 through the NMOS transistor MN. The PMOS transistor MP is turned off, and, thus, the voltage V1 of the first node NO1 is stabilized.

When a power supply voltage VDD increases, a swing level of the voltage V2 of the second node NO2 increases. Accordingly, transconductances Gm of the NMOS transistor MN and the PMOS transistor MP increase, and, thus, an input resistance R2 of the comparator 120 decreases. The decrease in the input resistance R2 results in a decrease in a swing level of the voltage V1 of the first node NO1. FIG. 2 is a graph illustrating a relationship between the power supply voltage VDD and the swing level of the voltage V1 of the first node NO1 and the swing level of the voltage V2 of the second node NO2. When the power supply voltage VDD increases, a noise level may increase too.

FIG. 3 illustrates that an undesired operation may occur when the reference current signal Iref is relatively low and the power supply voltage VDD increases in the conventional current mode receiving circuit. Referring to FIG. 3, when the reference current signal Iref is set to 200 uA and the power supply voltage VDD increases, an undesired operation occurs. When the reference current signal Iref increases, undesirable operations are reduced, but power consumption increases.

Accordingly, the conventional current mode receiving circuit has disadvantages in that, when the power supply voltage VDD increases, the noise level increases and the swing level of the voltage V1 of the first node NO1 decreases, thereby degrading a signal to noise ratio (SNR) and making it difficult to receive data at high speed.

SUMMARY

Some embodiments of the present invention provide a method of receiving a current mode signal, which can control a transconductance of a comparator of a current mode receiving circuit to increase an input resistance of the comparator according to an increase in a power supply voltage. Embodiments of current mode comparators and semiconductor devices that use the methods are also provided.

According to some embodiments of the present invention, there is provided a method of receiving a current mode signal, the method including: receiving a reference current signal and a data current signal through a channel and generating a sensing voltage based on a difference between the reference current signal and the data current signal; varying a transconductance to reduce an input resistance of the current mode comparator in inverse proportion to an increase in a power supply voltage supplied to the current mode comparator; and converting the sensing voltage into a CMOS level output signal using the current mode comparator.

According to other embodiments of the present invention, there is provided a current mode comparator comprising: first and second CMOS logic circuits connected in series to each other, and connected to a voltage sensing node of a receiving terminal, and operable to convert a voltage of the voltage sensing node to reflect a difference between a reference current signal and a data current signal into a CMOS level output signal; first and second transistors connected to the voltage sensing node, and turned on or off based on an output signal of the first CMOS logic circuit; a first cascode transistor connected in a cascade configuration to the first transistor, and operable to supply a first current from a first source to the voltage sensing node; a second cascode transistor connected in a cascade configuration to the second transistor, and operable to conduct a second current supplied from the second transistor to a ground terminal; and a transconductance correction unit connected to an output terminal of the first CMOS logic circuit, and operable to reduce transconductances of the first and second transistors in inverse proportion to an increase in a voltage of the first source.

The transconductance correction unit may comprise: third and fourth transistors connected to the output terminal of the first CMOS logic circuit, and turned on or off based on an output signal of the second CMOS logic circuit; a third cascode transistor connected in a cascade configuration to the third transistor, and operable to supply a third current from the first source to the output terminal of the first CMOS logic circuit according to the voltage of the voltage sensing node which is a bias voltage; and a fourth cascode transistor connected in a cascade configuration to the fourth transistor, and operable to conduct a current supplied from the fourth transistor to a ground terminal according to the voltage of the voltage sensing node, which is a bias voltage.

According to other embodiments of the present invention, there is provided a semiconductor device comprising: a receiver that is configured to receive a reference current signal and a data current signal through a channel and to generate a sensing voltage based on a difference between the reference current signal and the data current signal; and a comparator that is configured to vary a transconductance to reduce an input resistance in inverse proportion to an increase in a power supply voltage, and to convert the sensing voltage into a CMOS level output signal using the varied transconductance.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
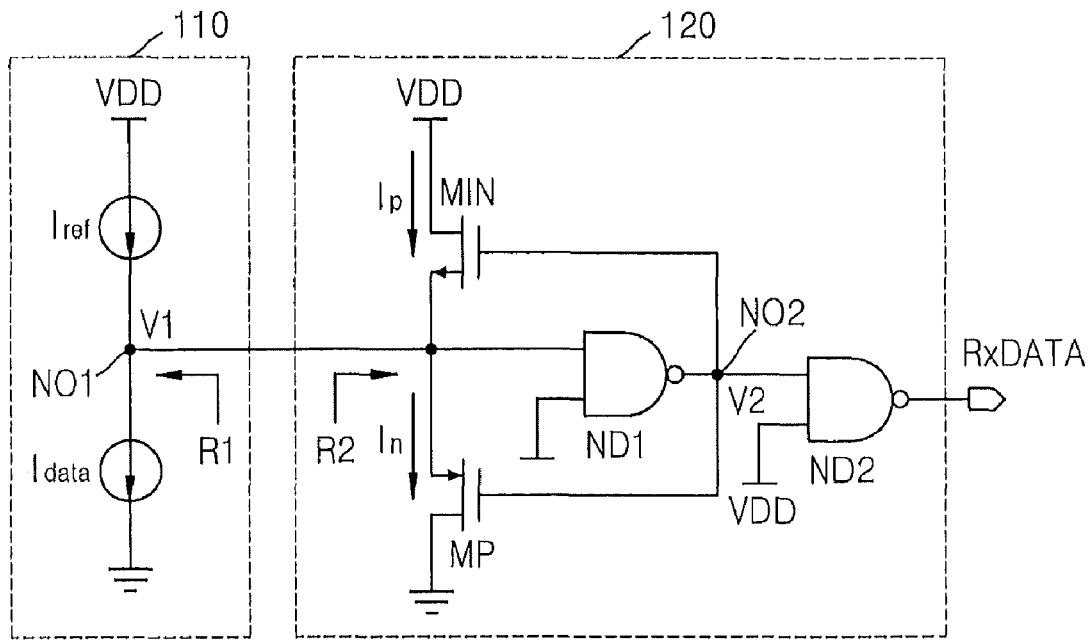
FIG. 1 is a circuit diagram of a conventional current mode receiving circuit.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 9:
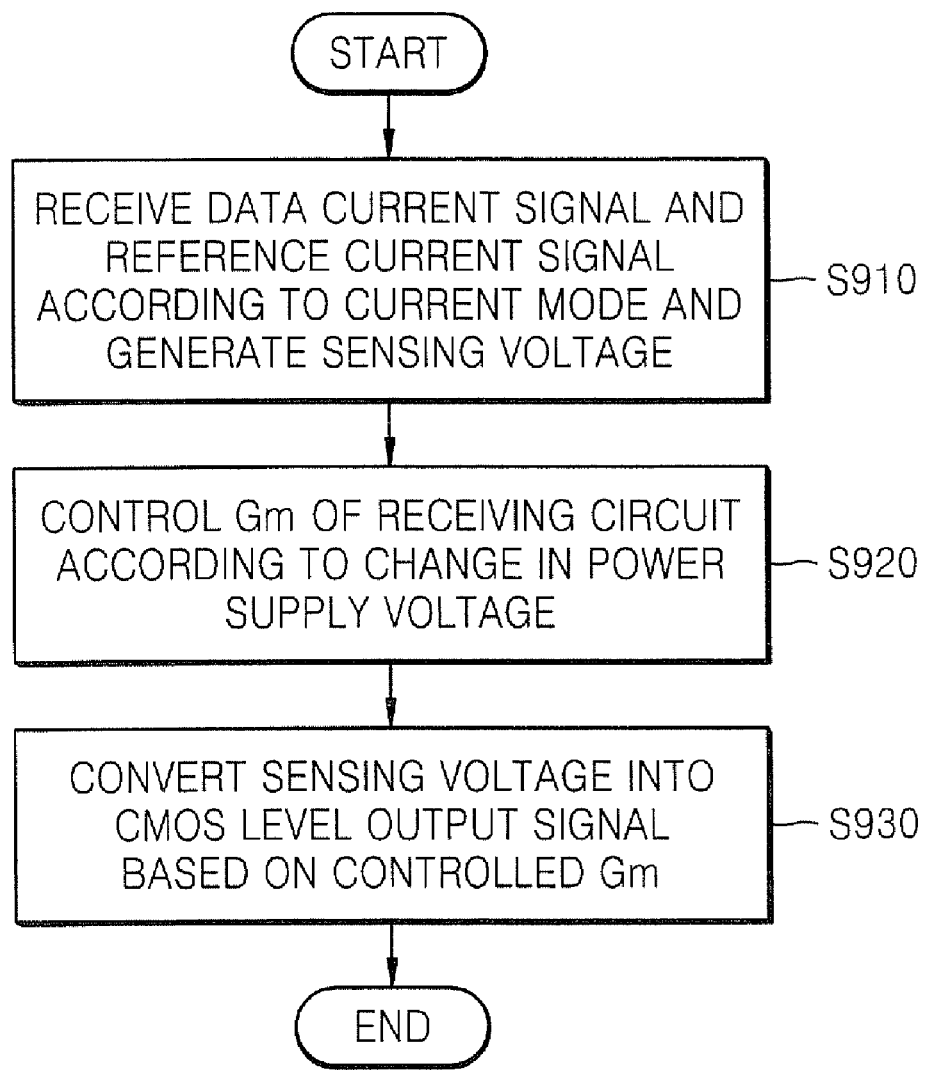
FIG. 9 is a flowchart illustrating a method of receiving a current mode signal according to some embodiments of the present invention.

Methods of receiving a current mode signal according to some embodiments of the present invention will now be explained with reference to FIG. 9.

In operation S910, a first semiconductor device at a receiving side receives a reference current signal and a data current signal through a channel connected to a second semiconductor device at a transmitting side, and generates a sensing voltage based on a difference between the reference current signal and the data current signal.

In operation S920, a transconductance Gm of a current mode comparator (referred to as a comparator), which converts the sensing voltage into a CMOS level output signal, is controlled according to a change in a power supply voltage supplied to the comparator.

That is, the transconductance Gm is controlled to reduce an input resistance of the comparator in inverse proportion to an increase in the power supply voltage applied to the comparator. Methods of controlling the transconductance Gm, according to some embodiments of the present invention, will be explained in detail below.

In operation S930, the sensing voltage generated in operation S910 is converted into a CMOS level output signal by the comparator whose transconductance is controlled based on the change in the power supply voltage to detect data.

Methods of controlling the transconductance Gm of the comparator according to the change in the power supply voltage will now be explained with reference to a comparator circuit.

Figure 4:
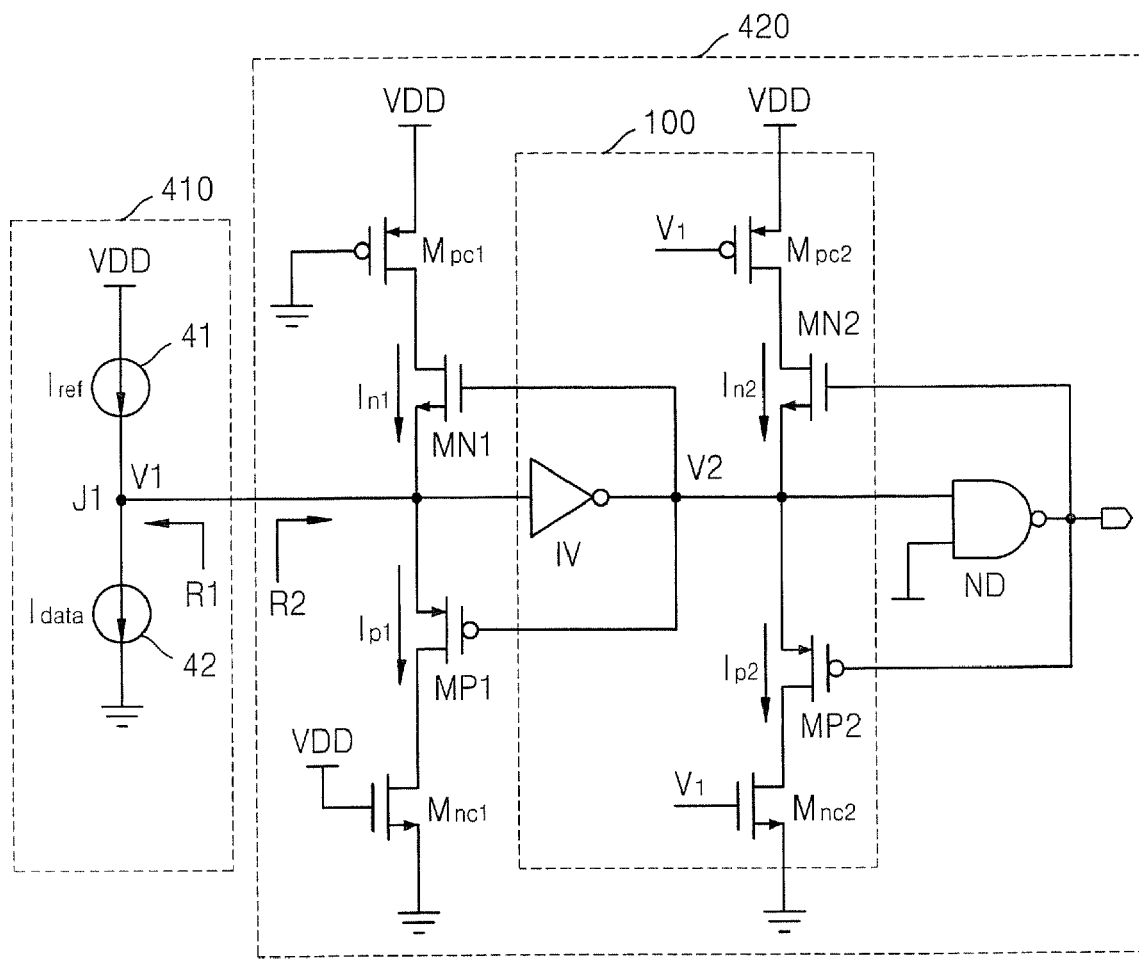
FIG. 4 is a circuit diagram of a current mode receiving circuit of a semiconductor device according to some embodiments of the present invention.

FIG. 4 is a circuit diagram of a current mode receiving circuit of a semiconductor device according to some embodiments of the present invention.

Referring to FIG. 4, the current mode receiving circuit of the semiconductor device includes a receiver 410 and a comparator 420. The receiver 410 receives a reference current signal Iref and a data current signal Idata transmitted through a channel from another semiconductor device (not shown), and generates a sensing voltage V1 based on a difference between the reference current signal Iref and the data current signal Idata.

Figure 5:
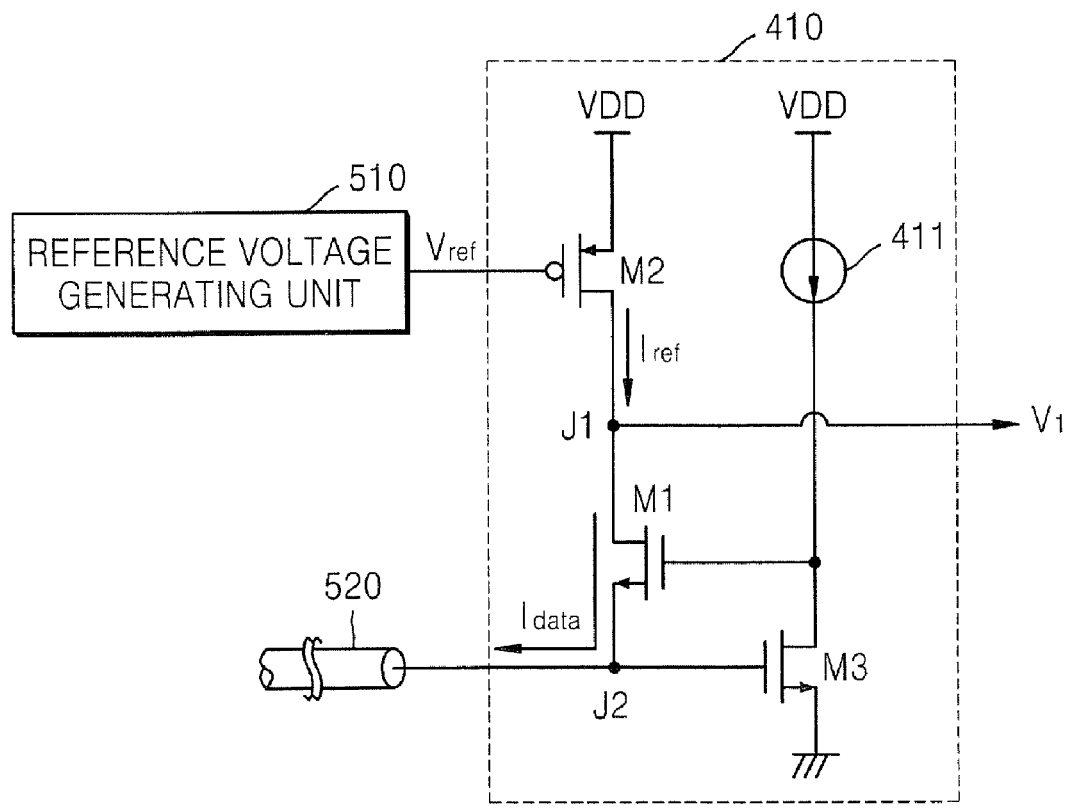
FIG. 5 is a detailed circuit diagram of a receiver of the current mode receiving circuit of FIG. 4.

FIG. 5 is a detailed circuit diagram of the receiver 410 of the current mode receiving circuit of FIG. 4. Operations of the receiver 410 will now be explained with reference to the circuit diagram of FIG. 5. In detail, the receiver 410 includes first through third transistors M1 through M3 and a current source 411. The first transistor M1 is connected to another semiconductor device through a channel 520, and receives an input data current signal Idata transmitted from the other semiconductor device. That is, the first transistor M1 acts as a current source 42 (see FIG. 4) that outputs the input data current signal Idata. A reference voltage generating unit 510 generates a reference voltage Vref according to an external reference current signal. The second transistor M2 acts as a reference current source 41 (see FIG. 4) that generates a reference current signal Iref according to the reference voltage Vref output from the reference voltage generating unit 510. The third transistor M3, which is an amplifier, provides negative feedback to an input node J2 and reduces a source resistance of the first transistor M1. The current source 411 supplies a bias current to the third transistor M3.

Operations of the comparator 420, according to some embodiments of the present invention, will now be explained. The comparator 420 includes first and second transistors MN1 and MP1, an inverter IV, a NAND gate ND, first and second cascode transistors Mpc1 and Mnc1 respectively connected in a cascade configuration to the first and second transistors MN1 and MP1, and a transconductance correction circuit 100 connected to the inverter IV and varying transconductances of the first transistor MN1 and the second transistor MP1 according to a change in a power supply voltage VDD.

The first transistor MN1 and the second cascode transistor Mnc1 are NMOS transistors, and the second transistor MP1 and the first cascode transistor Mpc1 are PMOS transistors.

The transconductance correction circuit 100 includes the inverter IV, third and fourth transistors MN2 and MP2, and third and fourth cascode transistors Mpc2 and Mnc2. For convenience of explanation, the third and fourth transistors MN2 and MP2 and the third and fourth cascode transistors Mpc2 and Mnc2 are collectively referred to as a transconductance correction unit. The third cascode transistor Mpc2 is a PMOS transistor, and the fourth cascode transistor Mnc2 is an NMOS transistor. The third and fourth cascode transistors Mpc2 and Mnc2 are respectively connected in a cascade configuration to the third and fourth transistors MN2 and MP2, and operate in an active region according to the voltage V1 of the voltage sensing node J1 which is a bias voltage.

Operations of the comparator 420, according to some embodiments of the present invention, will now be explained. Information corresponding to a difference between the input data current signal Idata and the reference current signal Iref is represented as a change in the voltage V1 of the voltage sensing node J1. The change in the voltage V1 of the voltage sensing node J1 is converted into a CMOS level voltage signal by the NAND gate ND and the inverter IV, which is a CMOS inverter, of the comparator 420.

The first and second transistors MN1 and MP1 of the comparator 420 are used to limit the voltage V1 of the first node NO1. The first and second transistors MN1 and MP1 operate in a saturation region, and only one of the first and second transistors MN1 and MP1 operates according to the relative levels of the input data current signal Idata and the reference current signal Iref.

If the input data current signal Idata is lower than the reference current signal Iref, the voltage V1 of the voltage sensing node J1 is higher than a predetermined voltage, for example, VDD/2, a voltage V2 of the inverter IV is at a low level, and an output signal of the NAND gate ND is at a high level. At this time, the first transistor MN1 is turned off and the second transistor MP1 is turned on, such that a current In (In=Iref−Idata) corresponding to a difference between the reference current signal Iref and the data current signal Idata flows through the second transistor MP1 to a ground terminal. The first transistor MN1 is turned off, and thus the voltage V1 of the voltage sensing node J1 is stabilized.

On the other hand, if the input data signal Idata is higher than the reference current signal Iref, the voltage V1 of the voltage sensing node J1 is lower than the predetermined voltage, for example, VDD/2, the voltage V2 of the inverter IV is at a high level, and the output signal of the NAND gate ND is at a low level. At this time, the first transistor MN1 is turned on and the second transistor MP1 is turned off, such that a current In (In=Idata−Iref) corresponding to a difference between the reference current signal Iref and the data current signal Idata is supplied through the first transistor MN1 to the voltage sensing node J1. The second transistor MP1 is turned off, and, thus, the voltage V1 of the voltage sensing node J1 is stabilized.

A swing level Δ V of the voltage V1 of the voltage sensing node J1 is defined $$\Delta V \propto \left( \frac{1}{Gmn1} + \frac{1}{Gmp1} \right) |I_{DATA} - I_{REF}| \quad (1)$$

where Gmn1 is a transconductance of the first transistor MN1, and Gmp1 is a transconductance of the second transistor MP1.

Accordingly, the swing level Δ V of the voltage V1 of the voltage sensing node J1 increases as the transconductance Gmn1 of the first transistor MN1 and the transconductance Gmp1 of the second transistor MP1 decrease. In other words, the swing level Δ V of the voltage V1 decreases as the transconductance Gmn1 of the first transistor MN1 and the transconductance Gmp1 of the second transistor MP1 increase.

Accordingly, the transconductance Gmn1 of the first transistor MN1 and the transconductance Gmp1 of the second transistor MP1 should decrease to increase an input resistance R2 of the comparator 420.

Figure 2:
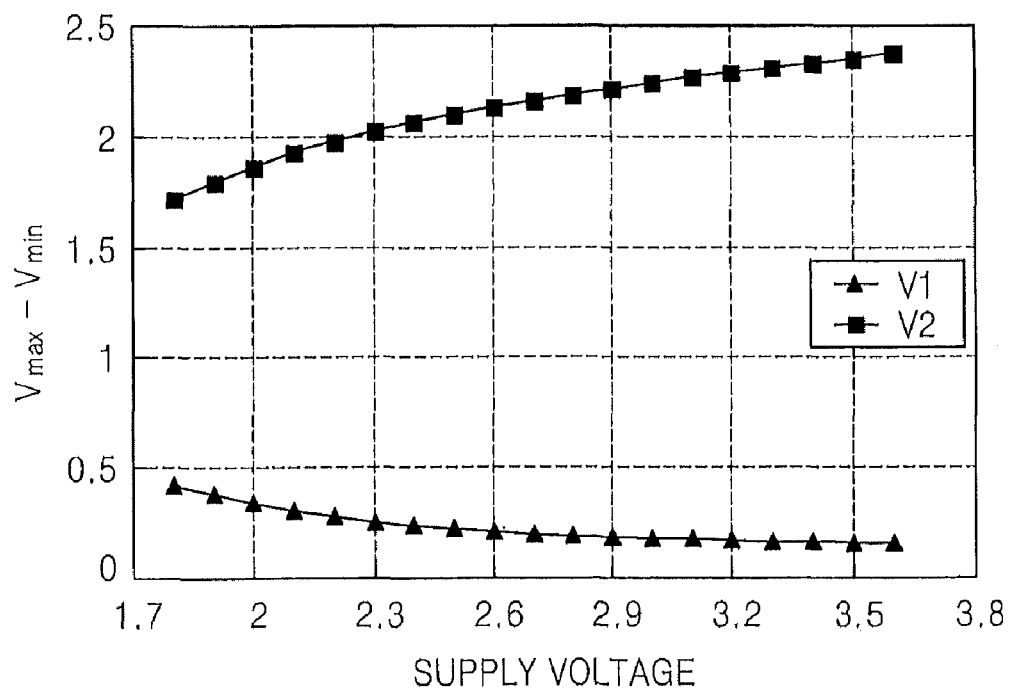
FIG. 2 is a graph illustrating a relationship between a power supply voltage and major signals in the conventional current mode receiving circuit.
Figure 3:
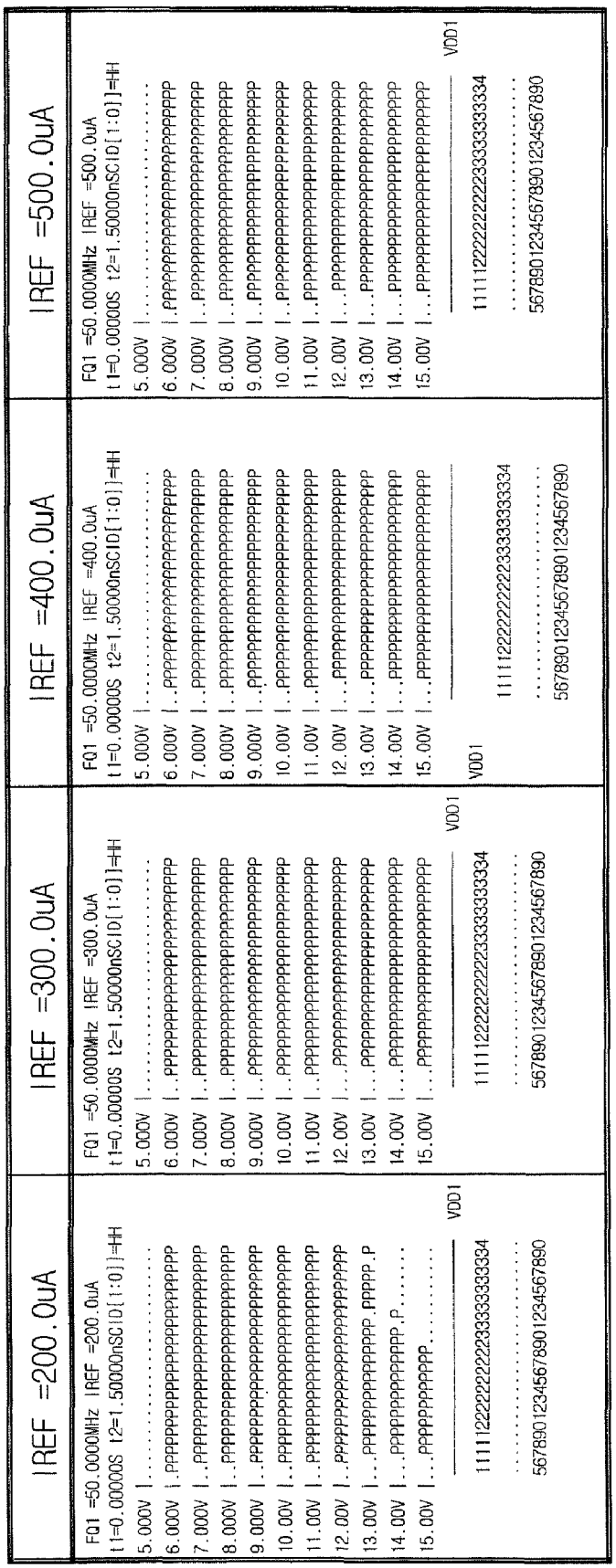
FIG. 3 illustrates an undesired operation when a reference current signal and a power supply voltage increase in the conventional current mode receiving circuit.

However, a conventional comparator 120 shown in FIG. 1 is configured such that a swing level of a voltage V2 of a second node NO2 increases as a power supply voltage VDD increases as shown in FIG. 2, and, thus, transconductances of an NMOS transistor MN and a PMOS transistor MP increase.

Accordingly, the conventional comparator 120 has a problem in that a swing level of a voltage V1 of a first node NO1 decreases as the power supply voltage increases as shown in FIG. 2. To address this problem, according to some embodiments of the present invention, the transconductance correction circuit 100 is added to the comparator 420 as shown in FIG. 4.

Methods of varying a transconductance according to a change in a power supply voltage VDD using the transconductance correction circuit 100, according to some embodiments of the present invention, will now be explained.

Figure 6:
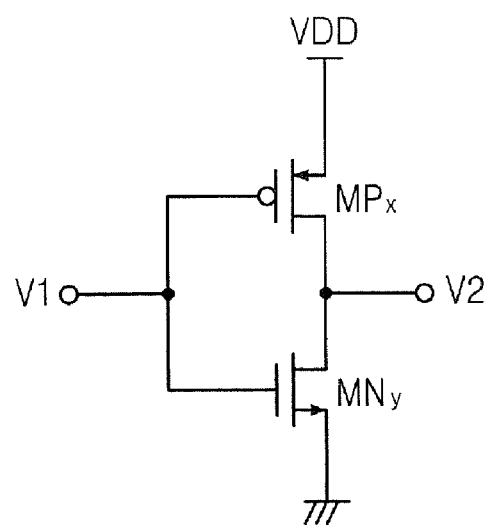
FIG. 6 is a detailed circuit diagram of an inverter of the current mode receiving circuit of FIG. 4.

FIG. 6 is a detailed circuit of the inverter IV included in the transconductance correction circuit 100. Referring to FIG. 6, the inverter IV includes a PMOS transistor MPx and an NMOS transistor MNy.

When the input data current signal Idata is higher than the reference current signal Iref and the voltage V1 of the voltage sensing node J1 is lower than the predetermined voltage, for example, VDD/2, the third transistor MN2 is turned off, the fourth transistor MP2 is turned on, and the fourth cascode transistor Mnc2 operates in an active region according to the bias voltage V1.

Figure 7:
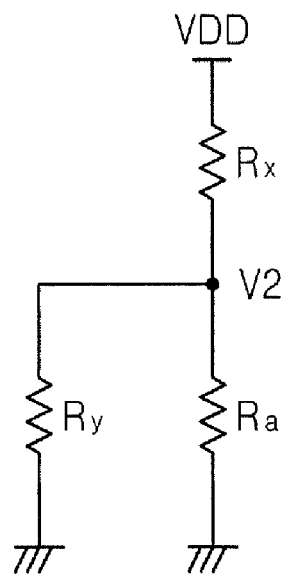
FIG. 7 is a circuit diagram illustrating an equivalent circuit of a transconductance correction circuit when a voltage of a voltage sensing node is at a low state in accordance with some embodiments of the present invention.

FIG. 7 is a circuit diagram illustrating an equivalent circuit of a transconductance correction circuit 100 when the voltage V1 of the voltage sensing node J1 is at the low state. In FIG. 7, Ry denotes a resistance of the NMOS transistor MNy of the inverter IV, Rx denotes a resistance of the PMOS transistor MPx of the inverter IV, and Ra denotes a sum of resistances of the fourth transistor MP2 and the fourth cascode transistor Mnc2.

In this case, the resistances Ra, Ry and Rx have a relationship of Ra>Ry>>Rx.

Accordingly, the voltage V2 is defined by $$V2 = \frac{Ry\|Ra}{Rx + (Ry\|Ra)} VDD. \quad (2)$$

When the input data current signal Idata is lower than the reference current signal Iref and the voltage V1 of the voltage sensing node J1 is higher than the predetermined voltage, for example, VDD/2, the fourth transistor MP2 is turned off, the third transistor MN2 is turned on, and the third cascode transistor Mpc2 operates in an active region according to the bias voltage V1.

Figure 8:
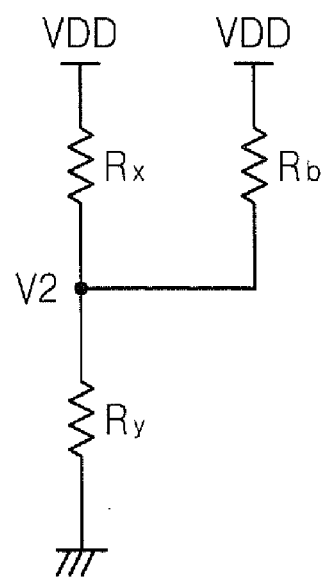
FIG. 8 is a circuit diagram illustrating an equivalent circuit of the transconductance correction circuit when the voltage of the voltage sensing node is at a high state in accordance with some embodiments of the present invention.

FIG. 8 is a circuit diagram illustrating an equivalent circuit of the transconductance correction circuit 100 when the voltage V1 of the voltage sensing node J1 is at the high state. In FIG. 8, Ry denotes a resistance of the NMOS transistor MNy, Rx denotes a resistance of the PMOS transistor MPx, and Rb denotes a sum of resistances of the third transistor MN2 and the third cascode transistor Mpc2.

The resistances Rb, Rx, and Ry have a relationship of Rb>Rx>>Ry.

Accordingly, the voltage V2 is defined by $$V2 = \frac{Ry}{Ry + (Rx\|Rb)} VDD. \quad (3)$$

Considering Equations 2 and 3, a swing level Δ V2 of the voltage V2 is defined by $$\Delta V2 = \left\{ \frac{Ry\|Ra}{Rx + (Ry\|Ra)} - \frac{Ry}{Ry + (Rx\|Rb)} \right\} VDD. \quad (4)$$

Because a swing level of the voltage V2 in the conventional comparator 120 of FIG. 1 is based on a difference between a power supply voltage VDD and a transistor threshold voltage, the swing level of the voltage V2 increases linearly with the increased power supply voltage VDD as shown in FIG. 2.

However, considering Equation 4, active resistances of the transistors of the transconductance correction circuit 100, according to some embodiments of the present invention, vary as the supply voltage VDD increases, and, thus, the swing level Δ V2 does not increase linearly. For reference, when the power supply voltage VDD exceeds a predetermined value, the swing level Δ V2 of the voltage V2 decreases with the increased power supply voltage VDD as shown in FIG. 10.

When the power supply voltage VDD exceeds the predetermined voltage value, the swing level Δ V2 of the voltage V2 decreases, and, thus, the transconductances Gmn1 and Gmp1 of the first and second transistors MN1 an MP1 of the comparator 420 decrease. When the transconductances Gmn1 and Gmp1 of the first and second transistors MN1 and MP1 decrease, the input resistance R2 of the comparator 420 increases.

Considering Equation 1, when the transconductances Gmn1 and Gmp1 of the first and second transistors MN1 and MP1 decrease, the swing level Δ V of the voltage V1 at the voltage sensing node J1 increases.

Figure 10:
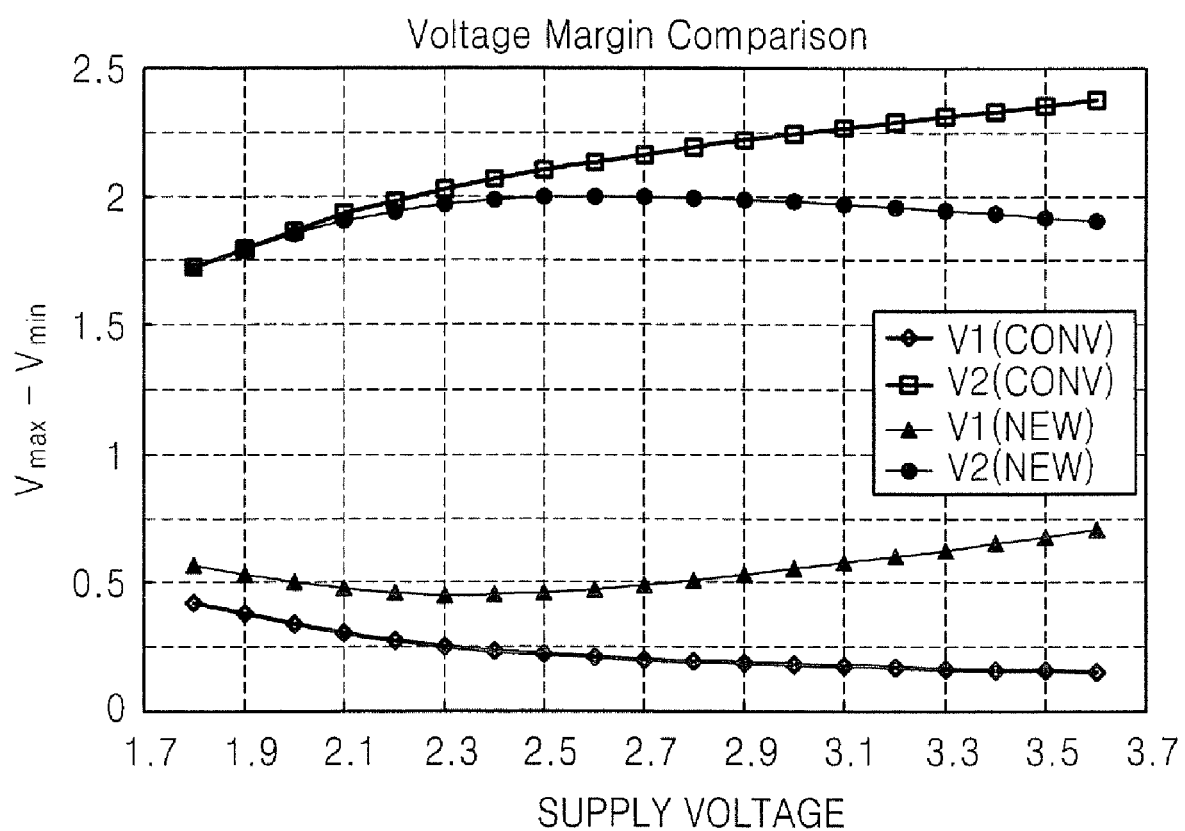
FIG. 10 is a graph illustrating a relationship between a power supply voltage and signals in a comparator according to some embodiments of the present invention and a conventional comparator.

FIG. 10 is a graph illustrating a relationship between the power supply voltage VDD and the voltages V1 and V2 in the comparator 420 of FIG. 4 and the conventional comparator 120 of FIG. 1. The swing levels of the voltages V1 and V2 in the comparator 420 of FIG. 4 are indicated by NEW and the swing levels of the voltage V1 and V2 in the conventional comparator 120 of FIG. 1 are indicated by CONV.

Referring to FIG. 10, the comparator 420 of FIG. 4 in which the swing level of the voltage V1 of the sensing node J1 increases when the power supply voltage VDD increases may provide an improved signal to noise ratio (SNR) as compared to the conventional comparator 120 of FIG. 1.

As described above, according to some embodiments of the present invention, because the transconductance of the current mode comparator is controlled to prevent the swing level of the voltage of the voltage sensing node from decreasing although the power supply voltage supplied to the current mode comparator is varied, signal detection performance can be improved. In particular, the SNR can be improved even when the power supply voltage supplied to the comparator increases.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A current mode comparator, comprising:
   first and second CMOS logic circuits connected in series to each other, and connected to a voltage sensing node of a receiving terminal, and operable to convert a voltage of the voltage sensing node to reflect a difference between a reference current signal and a data current signal into a CMOS level output signal;
   first and second transistors connected to the voltage sensing node that are turned on or off based on an output signal of the first CMOS logic circuit;
   a first cascode transistor connected in a cascade configuration to the first transistor, and supplying a first current from a first source to the voltage sensing node;
   a second cascode transistor connected in a cascade configuration to the second transistor, and conducting a second current supplied from the second transistor to a ground terminal; and
   a transconductance correction unit connected to an output terminal of the first CMOS logic circuit, and operable to reduce transconductances of the first and second transistors in inverse proportion of an increase in a voltage of the first source;
   wherein the first cascode transistor comprises a PMOS transistor having a first terminal connected to the first transistor, a second terminal connected to a ground line, and a third terminal connected to a second source.

2. The current mode comparator of claim 1, wherein the difference between the data current signal and the reference current signal is substantially the same as the level of the first current and second current.

3. The current mode comparator of claim 1, wherein the second cascode transistor comprises an NMOS transistor having a first terminal connected to the second transistor, a second terminal connected to the first source, and a third terminal connected to the ground line.

4. The current mode comparator of claim 1, wherein the transconductance correction unit comprises:
   third and fourth transistors connected to the output terminal of the first CMOS logic circuit, and turned on or off based on an output signal of the second CMOS logic circuit;
   a third cascode transistor connected in a cascade configuration to the third transistor, and operable to supply a third current from the first source to the output terminal of the first CMOS logic circuit according to the voltage of the voltage sensing node which is a bias voltage; and
   a fourth cascode transistor connected in a cascade configuration to the fourth transistor, and operable to conduct a current supplied from the fourth transistor to the ground terminal according to the voltage of the voltage sensing node which is a bias voltage.

5. The current mode comparator of claim 4, wherein the third transistor comprises an NMOS transistor having a first terminal connected to the third cascode transistor, a second terminal connected to an output terminal of the second CMOS logic circuit, and a third terminal connected to the output terminal of the first CMOS logic circuit.

6. The current mode comparator of claim 4, wherein the fourth transistor includes a PMOS transistor having a first terminal connected to the fourth cascode transistor, a second terminal connected to the output terminal of the second CMOS logic circuit, and a third terminal connected to the output terminal of the first CMOS logic circuit.

7. The current mode comparator of claim 4, wherein the third cascode transistor includes a PMOS transistor having a first terminal connected to the third transistor, a second terminal supplied with the voltage of the voltage sensing mode, and a third terminal connected to the first source.

8. The current mode comparator of claim 4, wherein the fourth cascode transistor includes an NMOS transistor having a first terminal connected to the fourth transistor, a second terminal configured to receive the voltage of the voltage sensing node, and a third terminal connected to the ground line.

9. The current mode comparator of claim 1, wherein the first CMOS logic circuit comprises a CMOS inverter connected to the voltage sensing node of the receiving terminal and is operable to invert a logic state of the voltage of the voltage sensing node to reflect the difference between the reference current signal and the data current signal.

10. The current mode comparator of claim 1, wherein the second CMOS logic circuit comprises a NAND gate having a first input terminal connected to the output terminal of the first CMOS logic circuit and a second input terminal connected to the first source and is operable to invert a logic state of a CMOS output terminal.

11. A semiconductor device, comprising:
    a receiver that is configured to receive a reference current signal and a data current signal through a channel and to generate a sensing voltage based on a difference between the reference current signal and the data current signal; and
    a comparator that is configured to vary a transconductance to reduce an input resistance in inverse proportion to an increase in a power supply voltage, and to convert the sensing voltage into a CMOS level output signal using the varied transconductance;
    wherein the comparator comprises:
    first and second CMOS logic circuits connected in series to each other and to a voltage sensing node, and operable to convert the sensing voltage into the CMOS level output signal;
    first and second transistors connected to an output terminal of the voltage sensing node that are turned on or off based on an output signal of the first CMOS logic circuit;
    a first cascode transistor connected in a cascade configuration to the first transistor, and supplying a first current from a first source to the voltage sensing node;
    a second cascode transistor connected in a cascade configuration to the second transistor, and conducting a second current supplied from the second transistor to a ground terminal; and
    a transconductance correction unit connected to an output terminal of the first CMOS logic circuit, and operable to reduce transconductances of the first and second transistors in inverse proportion to an increase in a voltage of the first source, the transconductance correction unit comprising:
    third and fourth transistors connected to the output terminal of the first CMOS logic circuit, and turned on or off based on an output signal of the second CMOS logic circuit;
    a third cascode transistor connected in a cascade configuration to the third transistor, and operable to supply a third current from the first source to the output terminal of the first CMOS logic circuit; and
    a fourth cascode transistor connected in a cascade configuration of the fourth transistor, and configured to receive a fourth current from a second source;
    wherein the third cascode transistor includes a PMOS transistor having a first terminal connected to the third transistor, a second terminal supplied with the voltage of the voltage sensing node, and a third terminal connected to the first source.

12. The semiconductor device of claim 11, wherein the third transistor comprises an NMOS transistor having a first terminal connected to the third cascode transistor, a second terminal connected to an output terminal of the second CMOS logic circuit, and a third terminal connected to the output terminal of the first CMOS logic circuit.

13. The semiconductor device of claim 11, wherein the fourth transistor includes a PMOS transistor having a first terminal connected to the fourth cascode transistor, a second terminal connected to the output terminal of the second CMOS logic circuit, and a third terminal connected to the output terminal of the first CMOS logic circuit.

14. The semiconductor device of claim 11, wherein the fourth cascode transistor includes an NMOS transistor having a first terminal connected to the fourth transistor, a second terminal configured to receive the voltage of the voltage sensing node, and a third terminal connected to a ground line.

* * * * *